United States Patent [19]

Carey

[11] 4,262,161

[45] Apr. 14, 1981

[54] COVERED SOLAR CELL ASSEMBLY

[75] Inventor: James E. Carey, Mullica Hill, N.J.

[73] Assignee: Shell Oil Company, Houston, Tex.

[21] Appl. No.: 112,584

[22] Filed: Jan. 16, 1980

[51] Int. Cl.³ .................................... H01L 31/00
[52] U.S. Cl. ................................ 136/256; 136/260; 136/265; 136/261
[58] Field of Search ............... 136/89 CC; 260/42.18; 136/89 CD, 89 CU, 89 SG, 89 CL, 89 EP

[56] References Cited

U.S. PATENT DOCUMENTS

| | | |
|---|---|---|
| 3,076,861 | 2/1963 | Samulon ............................ 136/89 |
| 3,533,850 | 10/1970 | Tarneja et al. ................... 136/89 |
| 3,539,883 | 11/1970 | Harrison ........................... 136/89 |
| 3,714,119 | 1/1973 | Marks et al. ................ 260/46.5 E |
| 3,780,424 | 12/1973 | Forestieri et al. ................. 29/572 |
| 3,912,540 | 10/1975 | Broder .............................. 136/89 |
| 3,957,537 | 5/1976 | Baskett et al. ................... 136/89 |
| 3,989,541 | 11/1976 | Brandhorst, Jr. .................. 136/89 |
| 4,053,327 | 10/1977 | Meulenberg, Jr. ........... 136/89 CC |
| 4,055,442 | 10/1977 | Crosher ...................... 136/89 CC |
| 4,072,541 | 2/1978 | Meulenberg, Jr. et al. ..... 136/89 SJ |
| 4,110,303 | 8/1978 | Gergen et al. ................ 260/42.18 |
| 4,133,699 | 1/1979 | Meulenberg, Jr. ........... 136/89 CC |

FOREIGN PATENT DOCUMENTS 2834161  2/1979  Fed. Rep. of Germany ...... 136/89 CL

OTHER PUBLICATIONS

D. C. Carmichael et al., "Materials For Encapsulation Systems For Terrestrial Photovoltaic Arrays," *Conf. Record, 12th IEEE Photovoltaic Specialists Conf.* (1976), pp. 317-331.

W. Carroll et al., "Material & Design Considerations of Encapsulants For Photovoltaic Arrays In Terrestrial Applications," *Conf. Record, 12th IEEE Photovoltaic Specialists Conf.* (1976), pp. 332-339.

E. F. Cuddihy et al., "Low-Cost Encapsulation Materials For Terrestrial Solar Cell Modules," *Solar Energy*, vol. 22, pp. 389-396 (1979).

*Primary Examiner*—Aaron Weisstuch
*Attorney, Agent, or Firm*—Dean F. Vance

[57] ABSTRACT

A covered solar cell having improved light reception characteristic comprises a layer of a semiconductor material, an electrical contact, a transparent cover plate and a transparent film interposed between the cover plate and the layer of semiconductor material wherein the transparent film contains a block copolymer having at least two monoalkenyl arene polymer end blocks A and at least one polymer mid block B selected from the group consisting of substantially completely hydrogenated conjugated diene polymer blocks, ethylene-propylene polymer blocks and ethylenebutene polymer blocks. Also disclosed and claimed are novel methods for making the covered solar cell.

10 Claims, 2 Drawing Figures

COVERED SOLAR CELL ASSEMBLY

BACKGROUND OF THE INVENTION

1. Field of the Invention

This invention relates generally to photovoltaic solar cells and to a method of making the cells. More particularly, the invention relates to the use of certain transparent films as anti-reflection or index-matching layers in solar cells.

2. The Prior Art

Solar cells in commercial use today are of generally two distinct types—cells based on wafers of silicon crystals and cells based on thin-film technologies, in particular, cadmium sulfide solar cells. In all solar cells, one of the major goals is to produce a cell that has a long life and does not degrade upon exposure to the environment. For example, condensed acids from rain, humidity-induced galvanic corrosion and other noxious atmospheric contaminants can cause corrosion of the cell. Accordingly, most cells are encapsulated in glass-covered, hermetically sealed cases. Examples of a variety of such cases are disclosed in U.S. Pat. Nos. 3,912,540; 3,989,541 and 4,036,645.

One problem that occurs when a smooth glass plate is used as the cover plate in a solar cell is that a non-uniform contact between the irregular cell surface and the glass results. Wherever there is a lack of true optical contact, air is included in the space. The difference in index of refraction of these volumes (air and glass) is such that some 8 to 10 percent of the incoming solar energy may be reflected away from the solar collector surface. Thus, it is desirable to fill the gaps between the glass and the cell with a material having an index of refraction greater than or equal to the glass cover plate in order to reduce reflection. Such materials, termed anti-reflection layers, have been employed in covered cells in the past. However, many of these layers have certain shortcomings, such as lack of stability and lack of easy workability. What is needed is some type of filler or anti-reflection layer that is transparent, stable under exposure to light, forms a good bond to both the glass and cell surface material, and is easy to work with.

SUMMARY OF THE INVENTION

The present invention comprises in general a novel covered cell containing a transparent film or anti-reflection layer having as an essential component a particular polymer which is light stable, has a refractive index close to glass, and is easy to work with. Specifically, the present invention encompasses a covered solar cell comprising:

(a) a layer of a semiconductor material;

(b) an electrical contact on the surface of said layer;

(c) a transparent cover plate covering the surface of said layer and said electrical contact; and (d) a transparent film between said cover plate and said electrical contact, said film comprising a block copolymer having at least two monoalkenyl arene polymer end blocks A and at least one polymer mid block B selected from the group consisting of substantially completely hydrogenated conjugated diene polymer blocks, ethylene-propylene polymer blocks annd ethylene-butene polymer blocks.

The layer of semiconductor material referred to above encompasses both the silicon-type technology and the thin film or cadmium sulfide-type technology, and should not be limited to any particular semiconductor material. The transparent films of the present invention have a number of advantages. For one, the particular block copolymer employed herein contains a minimum of olefinic unsaturation and is accordingly very light stable and will not significantly discolor or crosslink over time. In addition, the block copolymer by itself is tacky and will adhere to both the glass cover plate surface and the surface of the semiconductor material. If desired, adhesion promoters, suchh as various silanes, may be grafted to the block copolymer to improve adhesion. Additional components, such as oils and resins may also be employed with the block copolymer without causing a significant drop in transparency or tack. Still another advantage of these block copolymers is that they are "thermoplastic" elastomers and are easy to work with. A still further advantage of these block copolymers is that they act as a reducing medium, thereby scavenging oxygen on the surface of the solar cell and stabilizing the cell.

Also included in the present invention are a variety of means to form the covered cells. One means is a method of making a covered solar cell comprising:

(a) placing a transparent film on the surface of a layer of semiconductor material having an electrical contact positioned between said layer of semiconductor material and said transparent film wherein the transparent film comprises a block copolymer having at least two monoalkenyl arene polymer end blocks A and at least one polymer mid block B selected from the group consisting of substantially completely hydrogenated conjugated diene polymer blocks, ethylene-propylene polymer blocks and ethylene-butene polymer blocks;

(b) placing a transparent coverplate on the outer surface of said transparent film to form a solar cell assembly;

(c) heating the resulting assembly to a temperature above the softening point of the transparent film and below the decomposition temperature of the transparent film; and (d) applying an external pressure and/or vacuum to the heated assembly so as to improve the bond between the transparent film, layer of semiconductor material and transparent cover plate without substantially deforming the surface of said layer of semiconductor material.

One of the major advantages of the transparent films used in the above process is that they flow readily at low temperatures in vacuum pressing in order to effect displacement of the air in the irregularties between the cover plate and semiconductor surfaces without pressing the electrical contact against the semiconductor surface such as to cause destructive deformation of the semiconductor surface. This is an important consideration in maintaining the integrity of the solar cell. Still further, the film is tacky and bonds well to both the cover plate and the surface of the semiconductor material.

Another method employed in forming the covered cells of the present invention involves an improvement in a method of making a covered solar cell wherein a transparent cover plate is attached to a layer of a semiconductor material having attached to the outer surface thereof an electrical contact, the improvement comprising filling the space between said transparent cover plate and said layer of semiconductor material having attached electrical contact with a transparent composition comprising a block copolymer and a transparent oil, said block copolymer having at least two monoalkenyl arene polymer end blocks A and at least one polymer mid block B selected from the group consisting of substantially completely hydrogenated conjugated diene polymer blocks, ethylene-propylene polymer blocks and ethylene-butene polymer blocks. This process involves the use of a liquid transparent film material as oppossed to a solid film in the previous method. The transparent oil in this liquid-type process step acts as a flow modifier. Sufficient oil is added such that the transparent composition is liquid at fabrication conditions. However, the relative amount of oil is limited such that the composition does not flow readily from the cell should the cover plate be broken or otherwise leak.

DETAILED DESCRIPTION OF THE INVENTION

Figure 1:
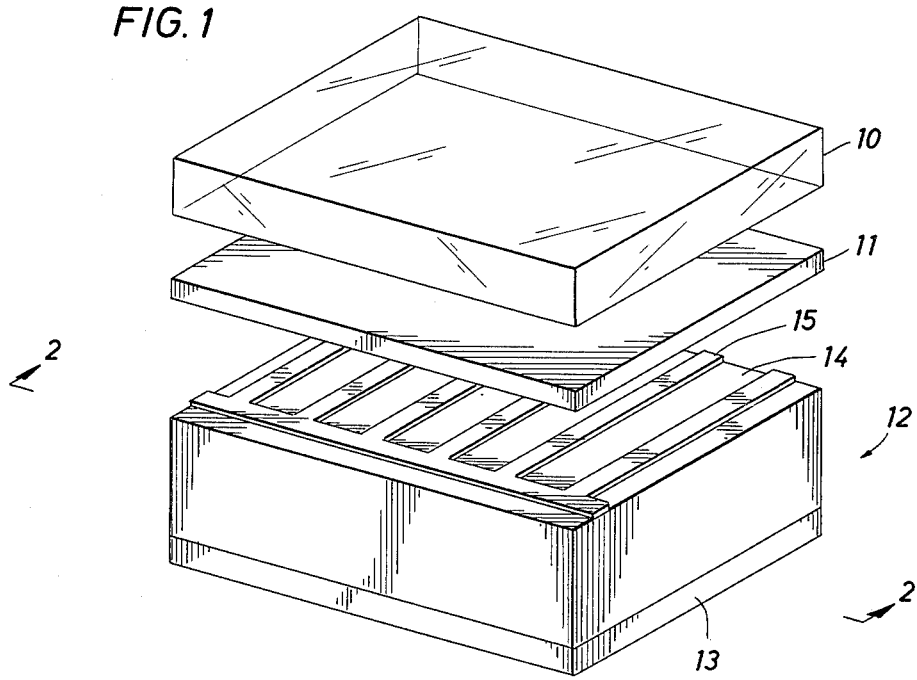
FIG. 1 is a perspective view of a solar cell assembly prior to attaching a cover glass.
Figure 2:
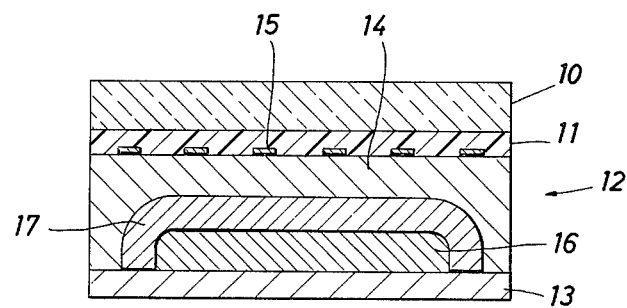
FIG. 2 is a vertical section view of the assembly shown in FIG. 1 taken along the line 2—2 showing a solar cell covered in accordance with the present invention.

Referring now to the drawing, FIG. 1 shows one of the preferred methods for forming the covered solar cell of the present invention. In FIG. 1, a cover plate 10, transparent film 11 and solar cell 12 are assembled to form a completed solar cell as shown in FIG. 2. The major components of the solar cell as shown in FIG. 1 are a bottom surface or substrate 13, a layer of semiconductor material 14, an electrical contact (also known as a grid or collector or collector grid) 15, a transparent anti-reflection layer 11 and the cover plate 10.

The cover plate 10 consists of a hard, transparent material that resists environmental attack. The cover plate must be light stable, i.e., not turn color on aging. Further, the cover plate should possess a low moisture vapor transmission rate. Preferred materials for the cover plate include glass, transparent fluorinated ethylenepropylene copolymers such as disclosed in U.S. Pat. No. 3,996,067 and other hard, clear plastics. In a preferred embodiment the cover plate is glass. While the figures show the cover plate as a single plate covering the upper surface of the cell, in actual commercial practice the entire cell is generally encased.

As stated above, the solar cell 12 includes, among other types, silicon solar cells, such as disclosed in U.S. Pat. Nos. 3,996,067 and 3,912,540, and thin film or cadmium sulfide type cells such as disclosed in U.S. Pat. Nos. 2,820,841 and 4,127,424. Preferably the solar cell is a cadmium sulfide-type solar cell. FIG. 2 specifically refers to a cadmium sulfide-type cell, and is not meant to be a limitation to the scope of the present invention. Referring to FIG. 2, the first step in forming a cadmium sulfide-type solar cell is to coat a substrate 13 with a conductive layer 16 to form the bottom electrode. Typical substrates include plastics, metals or ceramics. Various substrates are disclosed in U.S. Pat. Nos. 3,483,038, 3,376,163 and 4,127,424. The bottom electrode or conductive layer typically comprises a conductive metal such as copper or silver. More than one layer of metal may be deposited on the substrate if desired. In some cases the substrate may also be the bottom electrode, e.g., a molybdenum substrate may also serve as the electrode. In addition, a thin film of an electrically conductive metal such as zinc may be applied to the electrode.

Upon this bottom electrode a semiconductor material such as cadmium sulfide film 17 is deposited. This can be done in a known manner, such as through a suitably apertured mask from the vapor state. The thickness of the layer is typically about 20 microns to about 100 microns. The cadmium sulfide film 17 typically covers and completely overlaps all but a small portion of the bottom electrode. The uncovered portion can be used subsequently either for electrical connecting means to an adjacent cell, such as the top electrode of an adjacent cell to make a series connection therewith, or for a negative output terminal. When the substrate is insulating, as shown, the cadmium sulfide film 17 in each of the cells typically overlaps the remaining periphery of the bottom electrode and extends to the surface of substrate 13 in order that the subsequent overlapping films and the top electrode in each cell do not contact the bottom electrode layer 16.

The surface of the cadmium sulfide film 17 may be etched with hydrochloric acid for about 4–5 seconds, if desired, before the cuprous sulfide film is formed therein, as described in U.S. Pat. No. 3,480,473. The cuprous sulfide film 14 is formed in a suitable fashion such as, for example, deposition from the vapor state through a suitably apertured mask over the cadmium sulfide film 17, or by contacting the cadmium sulfide film 17 with an aqueous solution of a cuprous salt as, for example, a cuprous chloride or bromide solution, as described in Keramidas, U.S. Pat. No. 3,374,108. The cuprous sulfide film 14 will typically have a thickness between about 1000 A and about 10,000 A.

Upon the outer surface of the semiconductor material an electrical contact 15 or grid is attached. Typical grids are disclosed in U.S. Pat. Nos. 3,442,007, 3,888,697 and 3,978,333. A preferred electrical contact is the wire grid electrode disclosed in commonly assigned U.S. Patent Application Ser. No. 68,791, filed Aug. 22, 1979 and entitled "Electrode for Photovoltaic Cell".

Interposed between the cover plate 10 and the layer of semiconductor material 14 with attached electrical contact 15 is the transparent film 11 of the present invention. As essential component of this transparent film is a particular block copolymer. This block copolymer, as defined in U.S. Pat. No. 4,110,303, among other patents, has at least two monoalkenyl arene polymer end blocks A and at least one polymer mid block B selected from the group consisting of substantially completely hydrogenated conjugated diene polymer blocks, ethylene-propylene polymer blocks and ethylene-butene polymer blocks. The block copolymers employed in the present invention may have a variety of geometrical structures, since the invention does not depend on any specific geometrical structure, but rather upon the chemical constitution of each of the polymer blocks. Thus, the structures may be linear, radial or branched so long as each copolymer has at least two polymer end blocks A and at least one polymer mid block B as defined above. Methods for the preparation of such polymers are known in the art. Particular reference will be made to the use of lithium based catalysts and especially lithium alkyls for the preparation of the precursor polymers (polymers before hydrogenation). U.S. Pat. No. 3,595,942 not only describes some of the polymers of the present invention but also describes suitable methods for their hydrogenation. The structure of the polymers is determined by their method of polymerization. For example, linear polymers result by sequential introduction of the desired monomers into the reaction vessel when using such initiators as lithium-alkyls or dilithiostilbene and the like, or by coupling a two segment block copolymer with a difunctional coupling agent. Branched structures, on the other hand, may be obtained by the use of suitable coupling agents having a functionality with respect to the precursor polymers of three or more. Coupling may be effected with multifunctional coupling agents such as dihaloalkanes or alkenes and divinyl benzene as well as certain polar compounds such as silicon halides, siloxanes or esters of monohydric alcohols with carboxylic acids. The presence of any coupling residues in the polymer may be ignored for an adequate description of the polymers forming a part of the compositions of this invention. Likewise, in the generic sense, the specific structures also may be ignored. The invention applies especially to the use of selectively hydrogenated polymers having the configuration before hydrogenation of the following typical species:

polystyrene-polybutadiene-polystyrene (SBS)
polystyrene-polyisoprene-polystyrene (SIS)
poly(alpha-methylstyrene)-polybutadiene-poly(alpha-methylstyrene) and
poly(alpha-methylstyrene)-polyisoprene-poly(alpha-methylstyrene)

It will be understood that both blocks A and B may be either homopolymer or random copolymer blocks as long as each block predominates in at least one class of the monomers characterizing the blocks and as long as the A blocks individually predominate in monoalkenyl arenes and the B blocks individually predominate in dienes. The term "monoalkenyl arene" will be taken to include especially styrene and its analogs and homologs including alpha-methylstyrene and ring-substituted styrenes, particularly ring-methylated styrenes. The preferred monoalkenyl arenes are styrene and alpha-methylstyrene, and styrene is particularly preferred. The blocks B may comprise homopolymers of butadiene or isoprene and copolymers of one of these two dienes with a monoalkenyl arene as long as the blocks B predominate in conjugated diene units. When the monomer employed is butadiene, it is preferred that between about 35 and about 55 mol percent of the condensed butadiene units in the butadiene polymer block have 1,2 configuration. Thus, when such a block is hydrogenated, the resulting product is, or resembles a regular copolymer block of ethylene and butene-1 (EB). If the conjugated diene employed is isoprene, the resulting hydrogenated produce is or resembles a regular copolymer block of ethylene and propylene (EP). Ethylene-butene or ethylene-propylene blocks prepared via direct polymerization and not by hydrogenation of conjugated diene polymer blocks are also contemplated by the present invention.

Hydrogenation of the precursor block copolymers, if required, is preferably effected by use of a catalyst comprising the reaction products of an aluminum alkyl compound with nickel or cobalt carboxylates or alkoxides under such conditions as to substantially completely hydrogenate at least 80% of the aliphatic double bonds while hydrogenating no more than about 25% of the alkenyl arene aromatic double bonds. Preferred block copolymers are those where at least 99% of the aliphatic double bonds are hydrogenated while less than 5% of the aromatic double bonds are hydrogenated.

The average molecular weights of the individual blocks may vary within certain limits. In most instances, the monoalkenyl arene blocks will have number average molecular weights in the order of 5,000–125,000, preferably 7,000–60,000 while the conjugated diene blocks either before or after hydrogenation will have average molecular weights in the order of 10,000–300,000, preferably 30,000–150,000. The total average molecular weight of the block copolymer is typically in the order of 25,000 to about 250,000, preferably from about 35,000 to about 200,000. These molecular weights are most accurately determined by tritium counting methods or osmotic pressure measurements.

The proportion of the monoaklenyl arene blocks should be between about 8 and 55% by weight of the block copolymer, preferably between about 10 and 30% by weight.

In addition to the above-described block copolymer, the transparent film layer 11 may contain other components such as saturated hydrocarbon or mineral oils, hydrogenated or saturated hydrocarbon resins along with additives such as stabilizers and oxidation inhibitors. Aliphatic oils and resins are preferred to aromatic oils and resins since aromatics tend to cyclacize resulting in color bodies. Preferred oils are primarily aliphatic, saturated mineral oils. Preferred resins are saturated or hydrogenated hydrocarbon resins, such as hydrogenated polymers of dienes and olefins. These additional components must be transparent, light stable and compatible with the block copolymer component. The selection of the other components depends upon a number of factors—in particular, the method contemplated for making the covered solar cell.

As stated above, the compositions of the transparent film layer may be modified with supplementary materials such as stabilizers and oxidation inhibitors. Stabilizers and oxidation inhibitors are typically added to the block copolymer compounds in order to protect the polymers against degradation during preparation and use of the composition. Combinations of stabilizers are often more effective, due to the different mechanisms of degradation to which various polymers are subject. Certain hindered phenols, organo-metallic compounds, aromatic amines and sulfur compounds are useful for this purpose. Especially effective types of these materials include the following:

1. Benzothiazoles, such as 2-(dialkyl-hydroxybenzyl-thio) benzothiazoles.
2. Esters of hydroxybenzyl alcohols, such as benzoates, phthalates, stearates, adipates or acrylates of 3,5-dialkyl-1-hydroxy-benzyl alcohols.
3. Stannous phenyl catecholates.
4. Zinc dialkyl dithiocarbamates.
5. Alkyl phenols, e.g., 2,6-di-tert-butyl-4-methyl phenol.
6. Dilaurylthio-dipropionate.

Examples of commercially available antioxidants are "Ionox 220" 4,4-methylene-bis(2,6-di-t-butyl-phenol) and "Ionox 330" 3,4,6-tris(3,5-di-t-butyl-p-hydroxybenzyl)-1,3,5-trimethylbenzene, "Dalpac 4C" 2,6-di-(t-butyl)-p-cresol, "Naugawhite" alkylated bisphenol, "Butyl Zimate" zinc dibutyl dithiocarbamate, and "Agerite Geltrol" alkylated-arylated bisphenolic phosphite. From about 0.01 percent to about 5.0 percent by weight of one or more antioxidants is generally added to the composition.

In one embodiment of the present invention, the cover plate 10 is attached to the solar cell 12 and the transparent material 11 is injected into the open spaces between the cover plate and the solar cell. Accordingly, in this embodiment the material for the transparent layer should be a liquid at fabrication temperatures so as to permit easy flow into all spaces. Preferred compositions are about 98 to about 70 percent by weight of a transparent, light stable, saturated hydrocarbon oil and about 2 to about 30 percent by weight of the block copolymer. Preferably the oil is a primarily aliphatic mineral oil such as Exxon's Primol ® 3155 oil. The relative amounts of block copolymer and oil employed should be sufficient that the composition will not readily leak out of the cell should the cover plate break or become damaged. In a specific embodiment the composition going into the transparent layer comprises about 80 percent by weight of Primol 3155 hydrocarbon oil and 20 percent weight of a Shell Karton ® G block copolymer.

In an alternative embodiment, the transparent layer 11 is a solid sheet at ambient temperatures. While it is possible to employ solid sheets of just the block copolymer, it is preferred that supplemental components such as saturated hydrocarbon resins and/or saturated hydrocarbon oils be employed. The solid resins are added primarily to stiffen the sheet and provide additional tack while the liquid oils are added to soften the sheet. In a preferred embodiment a composition comprising 2 to about 70 weight percent of a hydrogenated hydrocarbon resin and 98 to about 30 weight percent of a block copolymer is employed. Preferably the composition comprises about 50 to about 85 percent by weight block copolymer and 50 to about 15 percent by weight resin. In a specific embodiment the hydrocarbon resin is Exxon's Escorez ® 5380 resin, which is apparently a hydrogenated polymer of a $C_5$ hydrocarbon. A preferred block copolymer is Shell's Karton ® G polymer. Other components such as the Primol 3155 fully saturated mineral oil, may be added as a softner to reduce stiffness.

The transparent sheets or films have a thickness between about 5 mils and about 25 mils, preferably between about 10 mils and about 20 mils. These sheets should be thick enough for ease of handling but not too thick such that they unduly restrict the incoming light.

When employing the process involving a solid sheet of transparent material, the assembly comprising the solar cell, transparent film and cover plate are heated to a temperature above the softening point of the transparent film, but below the temperature at which any decomposition takes place. In a specific embodiment the assembly is heated to a temperature between about 125° C. and about 165° C., preferably between about 145° C. and about 155° C. Sufficient pressure is applied to the heated assembly so as to improve the bond between the transparent film, layer of semiconductor material and transparent cover plate without substantially deforming the surface of the semiconductor material by pressing the electrical contact against the surface of the semiconductor material. In a specific embodiment, an external pressure of about 50 to about 100 psig, preferably about 75 to about 85 psig is applied. Alternatively, a vacuum may be employed to improve the bond between layers. The block copolymer of the present invention is particularly useful in this embodiment since it flows easily at low temperatures in vacuum pressing, thereby effecting the displacement of air in the irregulatities between the surfaces.

What is claimed is:

1. A covered solar cell comprising:
   (a) a layer of a semiconductor material;
   (b) an electrical contact on the surface of said layer;
   (c) a transparent cover plate covering the surface of said layer and said electrical contact; and
   (d) a transparent film between said cover plate and said electrical contact, said film comprising a block copolymer having at least two monoalkenyl arene polymer end blocks A and at least one polymer mid block B selected from the group consisting of substantially completely hydrogenated conjugated diene polymer blocks, ethylene-propylene polymer blocks and ethylene-butene polymer blocks.

2. A cell according to claim 1 wherein said layer of semiconductor material is a silicon-containing solar material.

3. A cell according to claim 1 wherein said layer of semiconductor material is a thin film-type solar material.

4. A cell according to claim 3 wherein said layer of semiconductor material is a cuprous sulfide layer.

5. A cell according to claim 1 wherein said cover plate is made of transparent glass.

6. A cell according to claim 1 wherein said monoalkenyl arene polymer blocks are polystyrene polymer blocks.

7. A cell according to claims 1, 4, 5 or 6 wherein said block copolymer is an S-EB-S block copolymer.

8. A cell according to claims 1, 4 or 5 wherein said transparent film comprises said block copolymer and at least one other transparent, light stable, compatible component.

9. A cell according to claim 8 wherein said other component is a transparent, fully-saturated mineral oil.

10. A cell according to claim 8 wherein said other component is a transparent, fully-saturated solid hydrocarbon resin.

* * * * *